(12) United States Patent
Arora et al.

(10) Patent No.: US 10,192,013 B1
(45) Date of Patent: Jan. 29, 2019

(54) TEST LOGIC AT REGISTER TRANSFER LEVEL IN AN INTEGRATED CIRCUIT DESIGN

(71) Applicant: Cadence Design Systems, Inc., San Jose, CA (US)

(72) Inventors: Puneet Arora, Noida (IN); Ankit Bandejia, Greater Noida (IN); Navneet Kaushik, Delhi (IN); Steven Lee Gregor, Owego, NY (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/376,394

(22) Filed: Dec. 12, 2016

(51) Int. Cl.
*G06F 17/50* (2006.01)
*G11C 29/12* (2006.01)

(52) U.S. Cl.
CPC ...... *G06F 17/5045* (2013.01); *G06F 17/5009* (2013.01); *G11C 29/1201* (2013.01)

(58) Field of Classification Search
CPC .................................................. G06F 17/5045
USPC ....................................................... 716/106
See application file for complete search history.

(56) References Cited

U.S. PATENT DOCUMENTS

| | | | |
|---|---|---|---|
| 6,691,286 B1 | 2/2004 | Mcelvain et al. | |
| 6,836,877 B1 * | 12/2004 | Dupenloup | G06F 17/5045 716/103 |
| 7,055,113 B2 | 5/2006 | Broberg, III et al. | |
| 7,069,523 B2 | 6/2006 | Nation et al. | |
| 7,072,818 B1 | 7/2006 | Beardslee et al. | |
| 7,188,325 B1 | 3/2007 | Evers et al. | |
| 7,430,725 B2 | 9/2008 | Broberg et al. | |
| 7,926,012 B1 * | 4/2011 | Parimi | G06F 17/505 324/76.66 |
| 7,979,759 B2 | 7/2011 | Carnevale et al. | |
| 8,239,818 B1 | 8/2012 | Monroe et al. | |
| 8,719,761 B2 | 5/2014 | Card et al. | |
| 8,762,675 B2 | 6/2014 | Wang | |
| 8,819,356 B2 | 8/2014 | Rajan et al. | |
| 8,832,608 B1 * | 9/2014 | Chakrabarty | G06F 17/505 716/51 |
| 8,990,749 B2 | 3/2015 | Arora et al. | |
| 9,529,947 B1 | 12/2016 | Chiu | |
| 10,095,822 B1 | 10/2018 | Kaushik et al. | |
| 2003/0023941 A1 * | 1/2003 | Wang | G01R 31/31704 716/103 |

(Continued)

OTHER PUBLICATIONS

"U.S. Appl. No. 15/376,403, Ex Parte Quayle Action mailed Jan. 5, 2018", 6 pgs.

(Continued)

*Primary Examiner* — Suresh Memula
(74) *Attorney, Agent, or Firm* — Schwegman Lundberg & Woessner, P.A.

(57) ABSTRACT

Electronic design automation (EDA) systems, methods, and computer readable media are presented for adding design for test (DFT) logic at register transfer level (RTL) into an integrated circuit (IC) design at RTL. In some embodiments, the DFT logic at RTL includes a port that connects to a hierarchical reference with a hierarchical path in the tree structure hierarchy to a part of the IC design at RTL. Such DFT modification helps to decrease the number of new ports added at this stage, and as a result assists subsequent debugging and back-annotation of RTL.

20 Claims, 13 Drawing Sheets

(56) References Cited

U.S. PATENT DOCUMENTS

| | | | |
|---|---|---|---|
| 2003/0145286 A1* | 7/2003 | Pajak | G01R 31/31704 716/106 |
| 2006/0271904 A1* | 11/2006 | Emerson | G01R 31/31704 716/111 |
| 2007/0005329 A1* | 1/2007 | Alfieri | G06F 17/5045 703/19 |
| 2008/0028347 A1 | 1/2008 | Hiraoglu et al. | |
| 2009/0288046 A1* | 11/2009 | Dorsch | G06F 17/5045 716/103 |
| 2012/0173943 A1* | 7/2012 | Cesari | G01B 31/31855 714/731 |
| 2016/0292330 A1* | 10/2016 | Theivendran | G06F 17/5022 |

OTHER PUBLICATIONS

"U.S. Appl. No. 15/376,403, Notice of Allowance dated Apr. 12, 2018", 5 pgs.

"U.S. Appl. No. 15/376,403, Response filed Mar. 5, 2018 to Ex Parte Quayle Action mailed Jan. 5, 2018", 10 pgs.

U.S. Appl. No. 15/685,893, Non Final Office Action dated Oct. 11, 2018, 6 pgs.

U.S. Appl. No. 15/685,902, Non Final Office Action dated Oct. 18, 2018, 5 pgs.

* cited by examiner

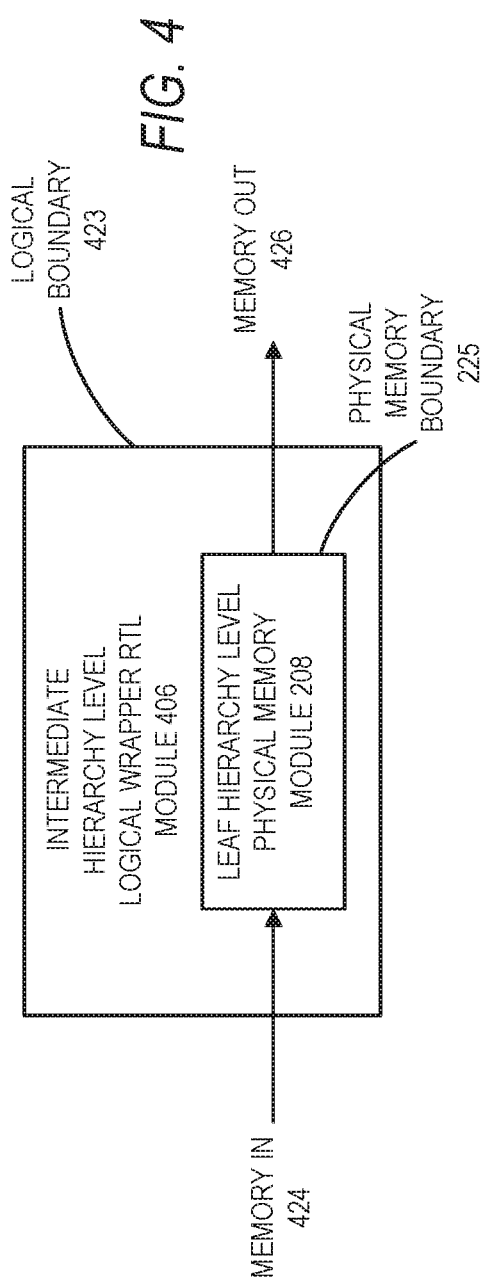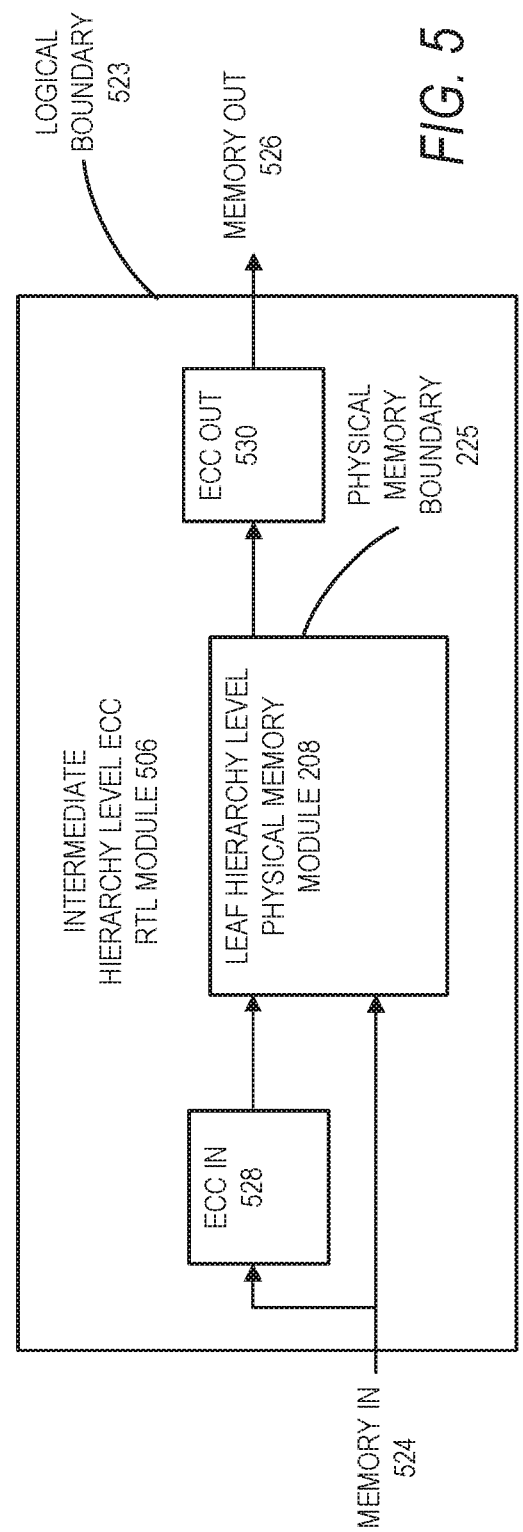

TEST LOGIC AT REGISTER TRANSFER LEVEL IN AN INTEGRATED CIRCUIT DESIGN

TECHNICAL FIELD

Embodiments described herein relate to electronic design automation (EDA), and to systems, methods, devices, and instructions for adding design for test (DFT) logic into an integrated circuit (IC) design at register transfer level (RTL).

BACKGROUND

EDA tools support the addition of DFT logic to an IC design to add testability features to the IC design. Traditionally, the EDA design flow and associated EDA tools have focused on adding the DFT logic to the IC design after the IC design is translated into a gate level netlist.

However, because the gate level netlist is a relatively low level representation of the IC design, the functionality of the IC design for the DFT logic and the original logic under test is relatively obscured. As a result, an EDA user has increased difficulty in debugging any simulation issues. Also, netlist simulation is much slower than RTL simulation—anywhere from 2x to 30x slower based on the extent of transformations from netlist to RTL. Also, some DFT logic at RTL helps in functional test and allows for better integration of the IC design with the designed system.

Existing approaches that insert DFT logic at RTL insert a wrapper to connect the DFT logic at RTL. Such approaches modify the original hierarchy of the original design under test and create new ports. The result complicates equivalence checking and debugging by making it difficult to compare the original design under test and the design under test subsequent to inserting DFT logic.

BRIEF DESCRIPTION OF THE DRAWINGS

The drawings illustrate example embodiments of the present disclosure and do not limit the scope of the present disclosure.

FIGS. 4-8 are diagrams illustrating examples of intermediate hierarchy level RTL modules with a logical boundary and containing a leaf hierarchy level RTL physical memory module with a physical memory boundary.

DETAILED DESCRIPTION

Example embodiments described herein relate to methods, computer readable media, and devices used for adding DFT logic at RTL into the IC design at RTL. While certain example embodiments are discussed, it will be apparent that other embodiments not specifically described herein, including embodiments adding various specific kinds of DFT logic, are attainable within the scope of the innovations presented herein. The following description and drawings illustrate specific embodiments to enable those skilled in the art to practice the specific embodiments. Other embodiments incorporate specific structural, logical, electrical, process, and/or other changes. In further embodiments, portions and/or features of some embodiments are included in, or substituted for, portions and/or features of other embodiments. Elements of the embodiments described herein cover all available equivalents of the described elements.

In some embodiments, the EDA computing device adds the DFT logic at RTL. The added DFT logic includes a port with a new connection to a hierarchical reference with a hierarchical path in a tree structure hierarchy to part of the original IC design at RTL. Because the port connects to a hierarchical reference of part of the original IC design, a new port does not have to be added to the original IC design at this EDA stage. In view of the number of memories in a modern IC design with an associated number of potential ports, the result has many fewer ports. Also, such connections can span across multiple hierarchies which would otherwise require complicated port creation at intermediate hierarchy levels. In addition, such connections also would otherwise require ongoing back-annotation of the changes into RTL. Thus, hierarchical references obviate complicated port creation and complicated back-annotation.

Figure 1:
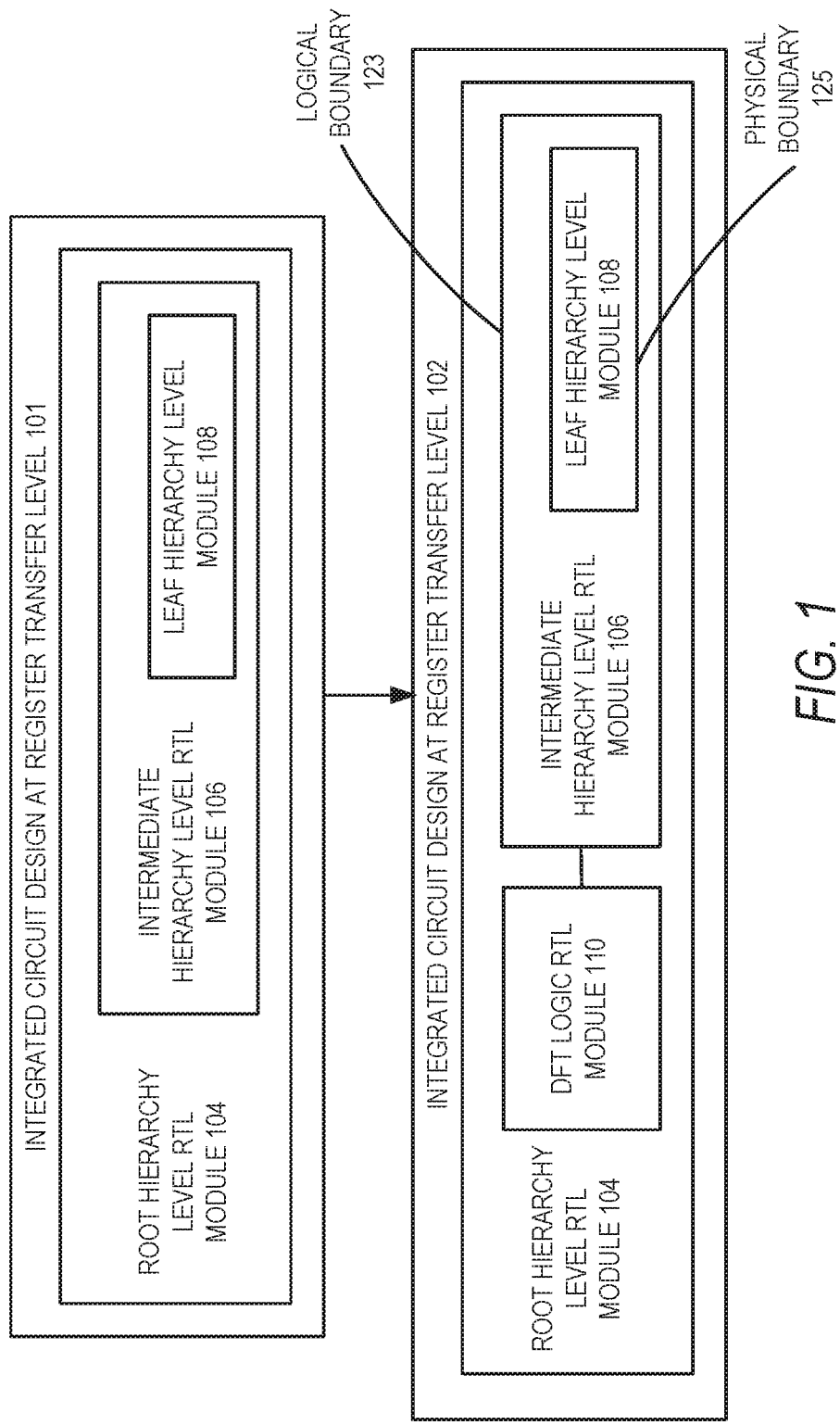
FIG. 1 is a diagram illustrating an example of adding a DFT logic RTL module to an IC design at RTL.

FIG. 1 is a diagram illustrating an example of adding a DFT logic RTL module to an IC design at RTL. An IC design at RTL 101 is received by an EDA computing device. The IC design at RTL 101 has a tree structure hierarchy organizing RTL modules. The IC design at RTL 101 includes root hierarchy level RTL module 104, that in turn includes intermediate hierarchy level RTL module 106, that in turn includes leaf hierarchy level physical memory module 108.

In an IC design at RTL 102, DFT logic RTL module 110 is added to root hierarchy level RTL module 104. DFT logic RTL module 110 is coupled to leaf hierarchy level module 108 via logical boundary 123 of intermediate hierarchy level module 106, rather than directly via physical boundary 125 of leaf hierarchy level module 108. Examples of DFT logic are scan testing logic, functional test logic, BIST logic, and delay fault testing logic.

A particular module has a physical boundary when the particular module, such as a particular memory module, is at a leaf hierarchy level. The particular module is subject to elaboration into a netlist with a library module that directly represents the particular module. The particular design is subject to elaboration into a netlist with a library module that directly represents the particular memory module.

A particular RTL module has a logical boundary when the particular RTL module is at an intermediate hierarchy level. The particular RTL module is subject to elaboration into a netlist with at least one library module that directly represents at least one leaf hierarchy level RTL module contained in the particular RTL module. Alternatively, the particular RTL module contains another intermediate hierarchy level RTL module, which in turn contains at least one leaf hierarchy level RTL module and/or at least one other intermediate hierarchy level RTL module.

Figure 2:
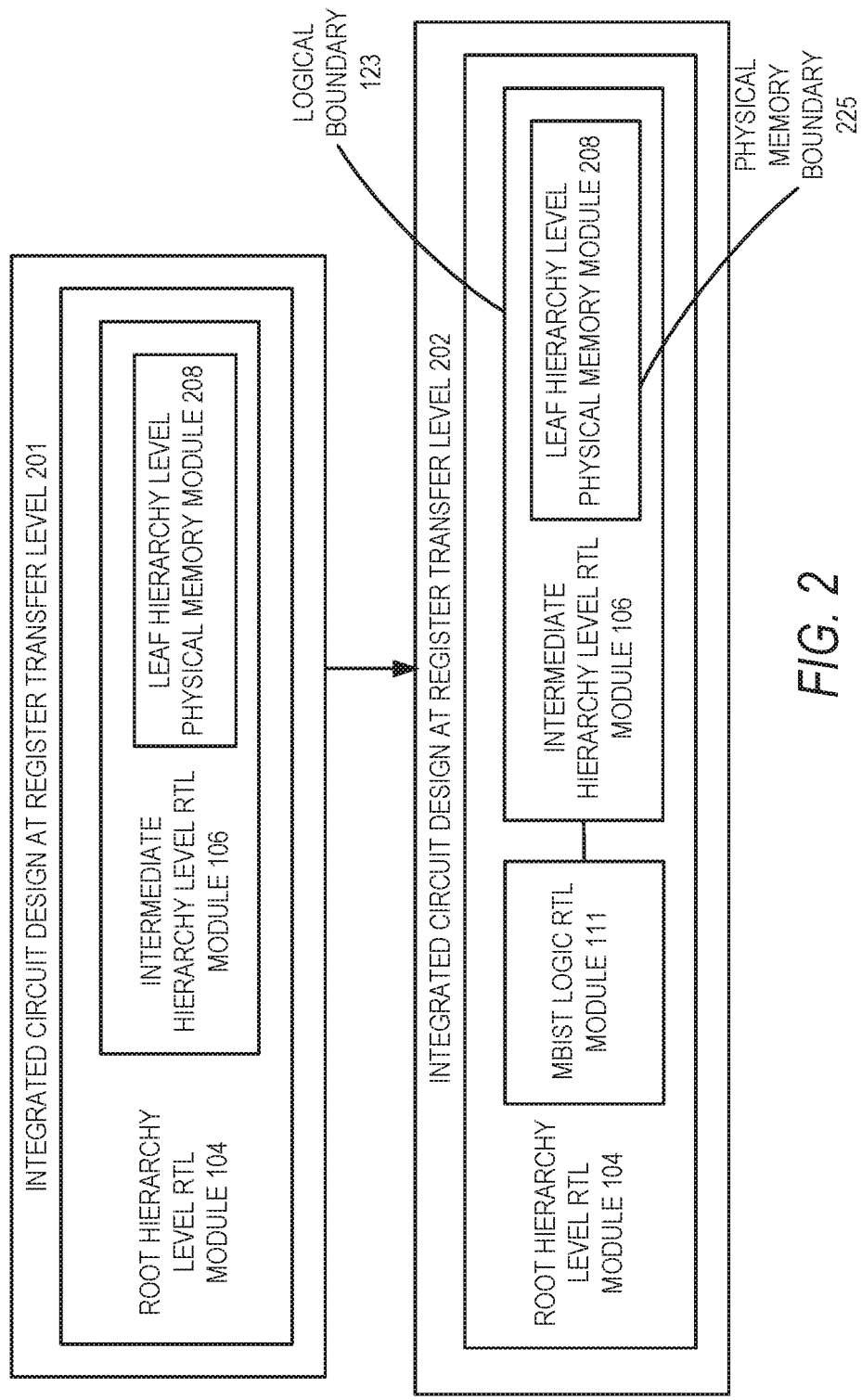
FIG. 2 is a diagram illustrating an example of adding an MBIST logic RTL module to an IC design at RTL.

FIG. 2 is a diagram illustrating an example of adding an MBIST logic RTL module to an IC design at RTL. FIG. 2 is similar to FIG. 1. In FIG. 2, the DFT logic RTL module is MBIST logic RTL module 111. Also, the leaf hierarchy level module is leaf hierarchy level physical memory module 208 with physical memory boundary 225. MBIST logic is DFT logic that detects memory faults using a clock, data and address generator, and read/write controller. In some embodiments, the MBIST logic is a multiplexer that switches input between test and non-test data inputs. In some embodiments MBIST logic is memory testing logic that comprises one or more of: a BIST engine that generates a series of read-write operations for memory testing, a comparator, a set of multiplexers or other collar logic that multiplexes the memory inputs for functional and memory testing operations. In other embodiments MBIST logic includes components that test ROM contents, components that repair, a different unit to store information on which algorithm to run, and logic to handle clock gating.

In some embodiments, the same MBIST logic is coupled to one or more of: different physical memories via different logical boundaries, a first physical memory directly (not via a logical boundary) and a second physical memory via a logical boundary, and iii) different physical memories directly (not via any logical boundary).

Figure 3:
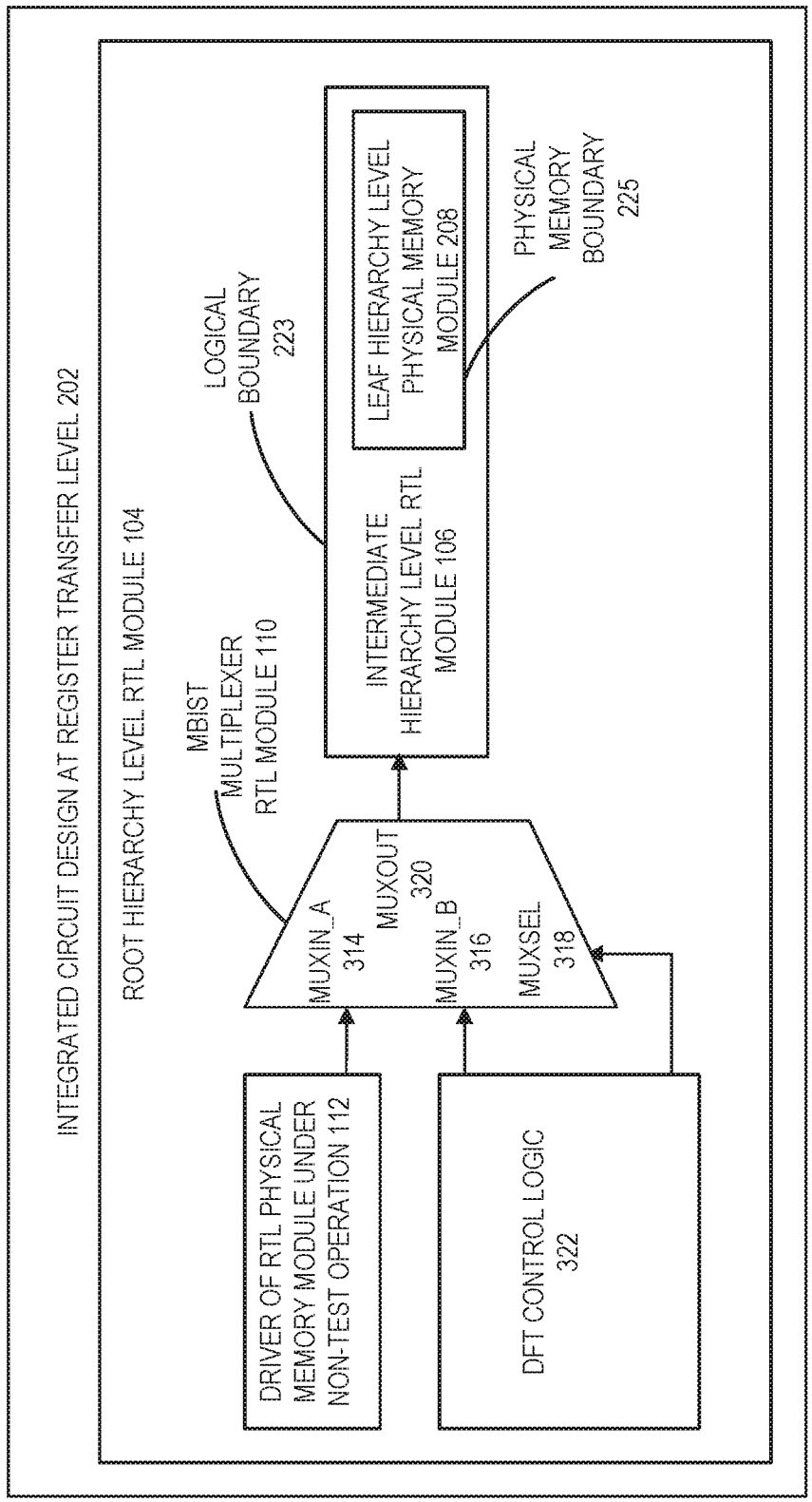
FIG. 3 is a more detailed diagram illustrating an example of adding an MBIST multiplexer RTL module to an IC design at RTL.

FIG. 3 is a more detailed diagram illustrating an example of adding an MBIST multiplexer RTL module to an IC design at RTL. MBIST multiplexer RTL module 111 has data inputs MUXIN_A 314 and MUXIN_B 316, selector input MUXSEL 318, and output MUXOUT 320. Responsive to a selector signal received at selector input MUXSEL 318, MBIST multiplexer RTL module 110 connects output MUXOUT 320 to either data input MUXIN_A 314 or data input MUXIN_B 316. Data input MUXIN_A 314 receives data from a driver of RTL physical memory module under non-test operation 112. Data input MUXIN_B 316 receives data from DFT control logic 322. Output MUXOUT 320 is coupled to leaf hierarchy level physical memory module 208 via logical boundary 223 of intermediate hierarchy level RTL module 106. During test operation, DFT control logic sends a signal to MUXSEL 318 to connect MUXIN_B 316 to MUXOUT 320. During non-test operation, DFT control logic sends a signal to MUXSEL 318 to connect MUXIN_A 314 to MUXOUT 320.

FIGS. 4-8 are diagrams illustrating examples of intermediate hierarchy level RTL modules with a logical boundary and containing a leaf hierarchy level RTL physical memory module with a physical memory boundary. The non-exhaustive examples are illustrative of intermediate hierarchy level RTL modules discussed elsewhere.

FIG. 4 shows intermediate hierarchy level logical wrapper RTL module 406 with memory in 424, memory out 426, and logical boundary 423 that contains leaf hierarchy level physical memory module 208 with physical memory boundary 225. In one particular example, leaf hierarchy level physical memory module 208 is the only module contained in intermediate hierarchy level logical wrapper RTL module 406. In such an example, logical boundary 423 and physical memory boundary 225 are nevertheless distinct, because of the intervening hierarchy and logical boundary 423 in between leaf hierarchy level physical memory module 208 and memory in 424.

FIG. 5 shows intermediate hierarchy level error correcting code (ECC) RTL module 506 with memory in 524, memory out 526, and logical boundary 523 that contains ECC in 528, ECC out 530, and leaf hierarchy level physical memory module 208 with physical memory boundary 225. ECC in 528 and ECC out 530 perform error correction and/or error detection on memory writes and memory reads.

Figure 6:
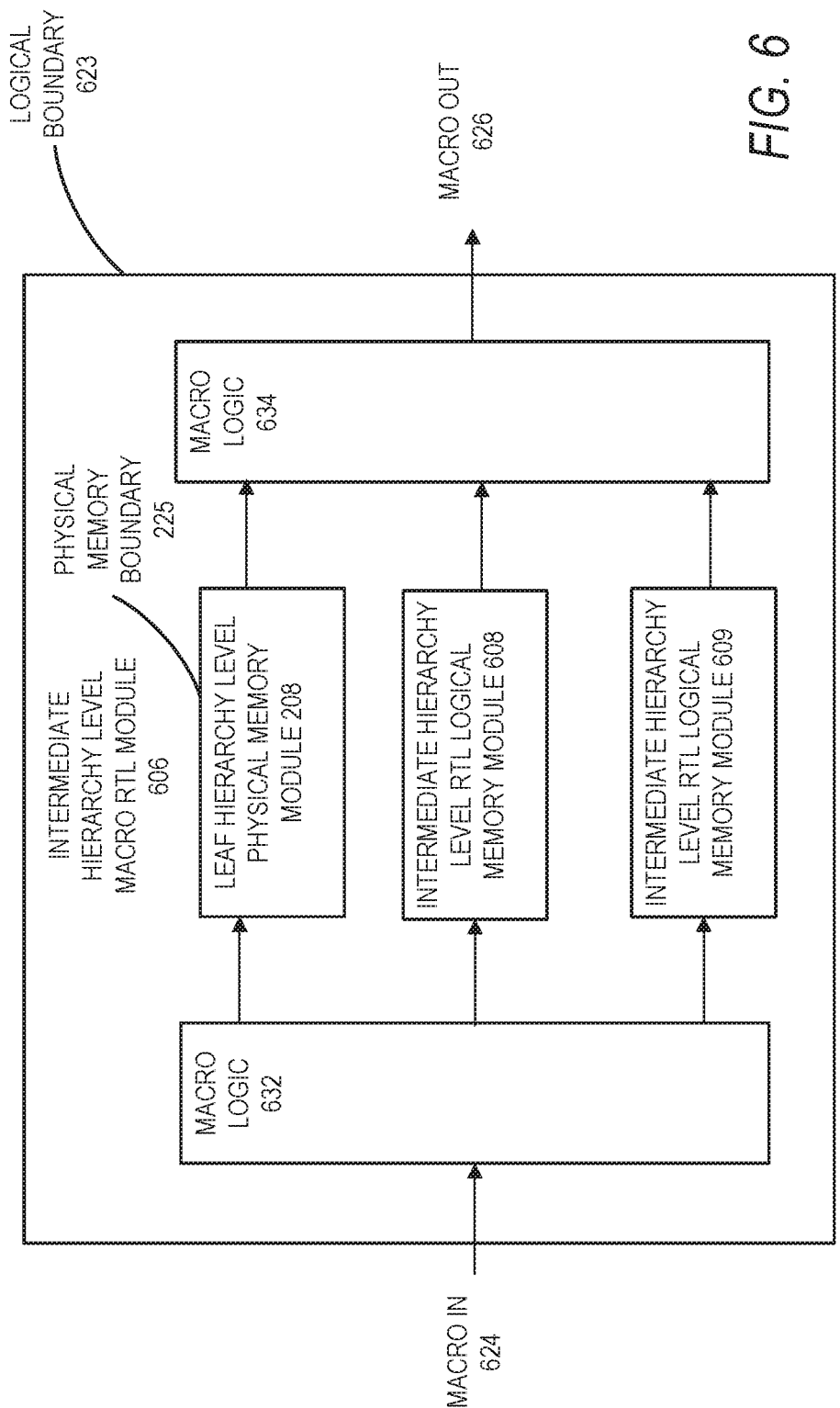

FIG. 6 shows intermediate hierarchy level macro RTL module 606 with macro in 624, macro out 626, and logical boundary 623 that contains macro logic 632, macro logic 634, intermediate hierarchy level RTL logical memory module 608, intermediate hierarchy level RTL logical memory module 609, and leaf hierarchy level physical memory module 208 with physical memory boundary 225. Macro logic 632 performs macro block functions on data from macro in 632, and macro logic 634 provides data for macro out 626. Examples of macros are relatively complicated circuits and IPs from third party vendors.

Figure 7:
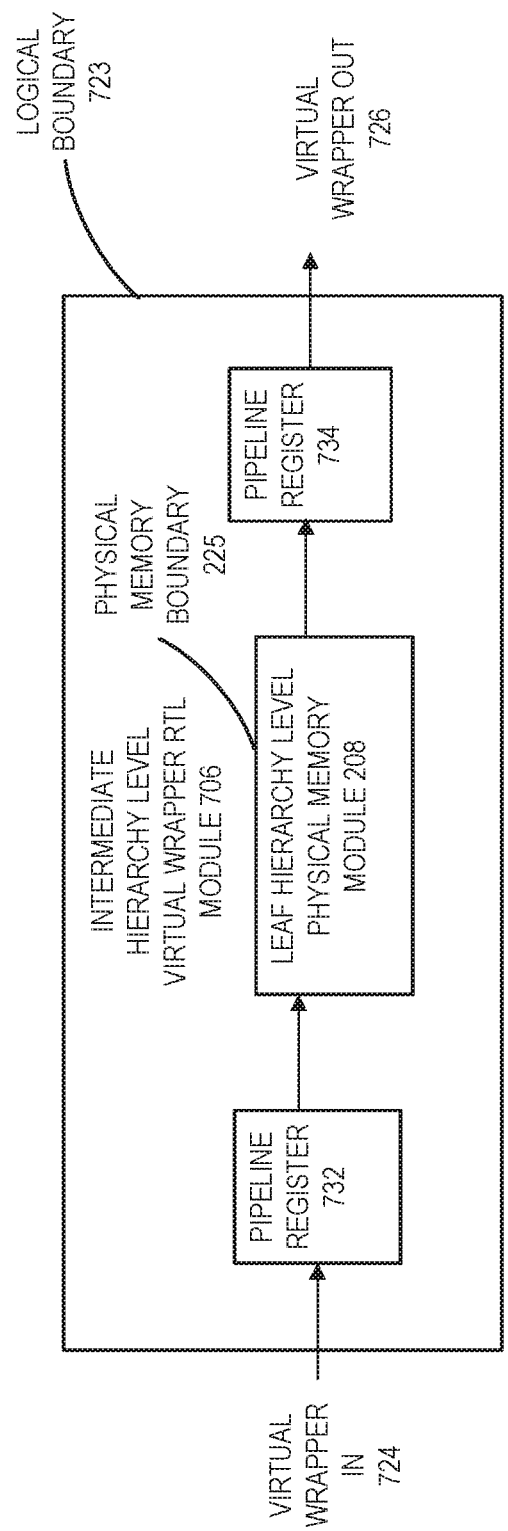

FIG. 7 shows intermediate hierarchy level virtual wrapper RTL module 706 with virtual wrapper in 724, virtual wrapper out 726, and logical boundary 723 that contains pipeline register 732, pipeline register 734, and leaf hierarchy level physical memory module 208 with physical memory boundary 225. Pipeline register 732 adds a controlled delay between virtual wrapper in 724 and leaf hierarchy level physical memory module 208. Pipeline register 734 adds a controlled delay between leaf hierarchy level physical memory module 208 and virtual wrapper out 726. In some embodiments of the virtual wrapper case, the logical boundary can span over multiple logical boundaries. In some embodiments, "..." keyword support handles the virtual wrapper case where multiple logical hierarchies combined are looked upon as a single entity from memory testing perspective.

Figure 8:
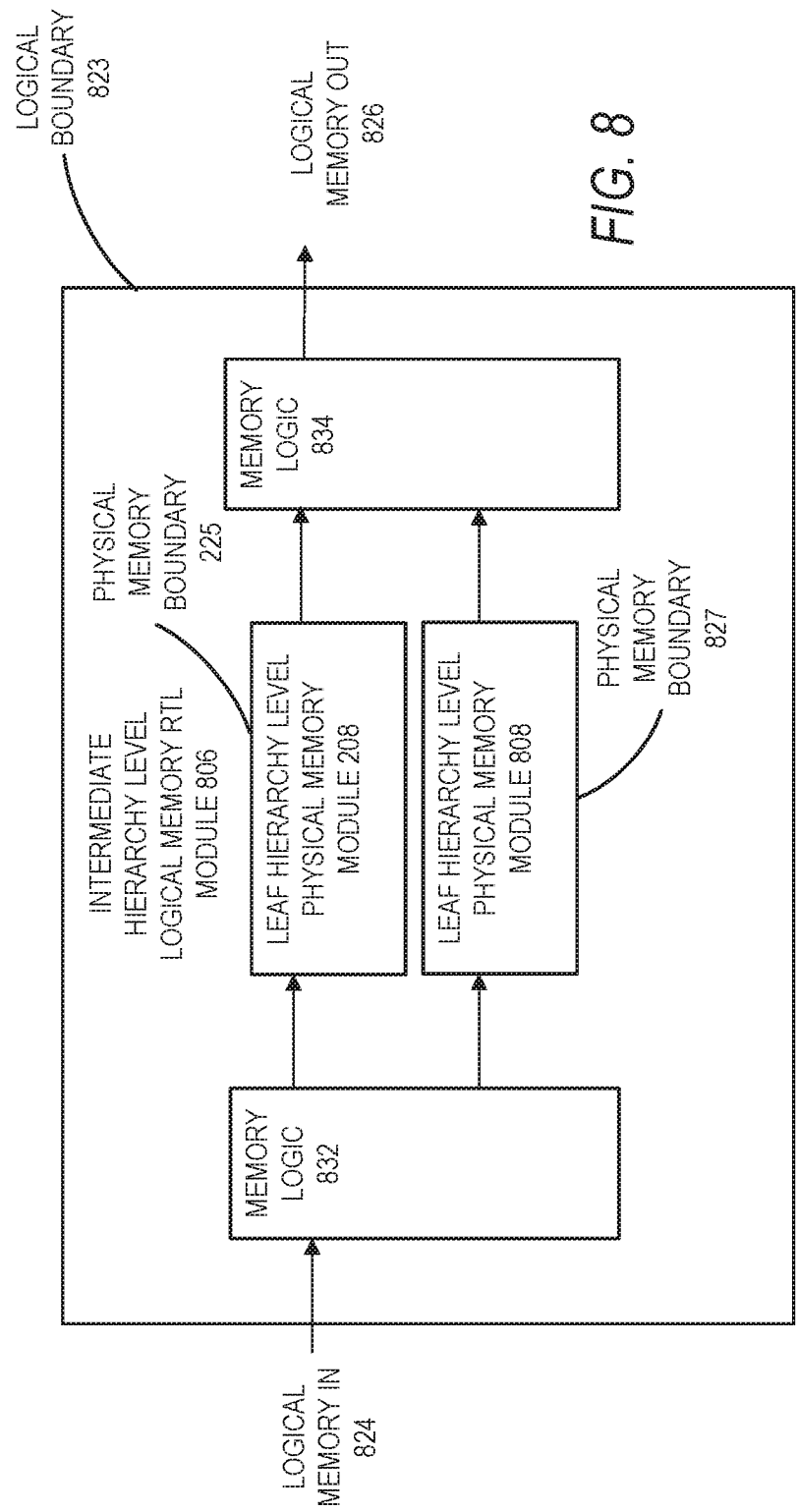

FIG. 8 shows intermediate hierarchy level logical memory RTL module 806 with logical memory in 824, logical memory out 826, and logical boundary 823 that contains memory logic 832, memory logic 834, leaf hierarchy level physical memory module 208 with physical memory boundary 225, and leaf hierarchy level physical memory module 808 with physical memory boundary 827. Memory logic 832 performs memory input functions such as address decoding. Memory logic 834 performs memory output functions such as output multiplexing.

Logical boundary 823 is distinct from both physical memory boundary 225 and physical memory boundary 827. Distinguishing factors include one or more of: the intervening hierarchy, logical boundary 823 in between leaf hierarchy level physical memory module 208 and logical memory in 824, and logical boundary 823 in between leaf hierarchy level physical memory module 808 and logical memory in 824.

Figure 9:
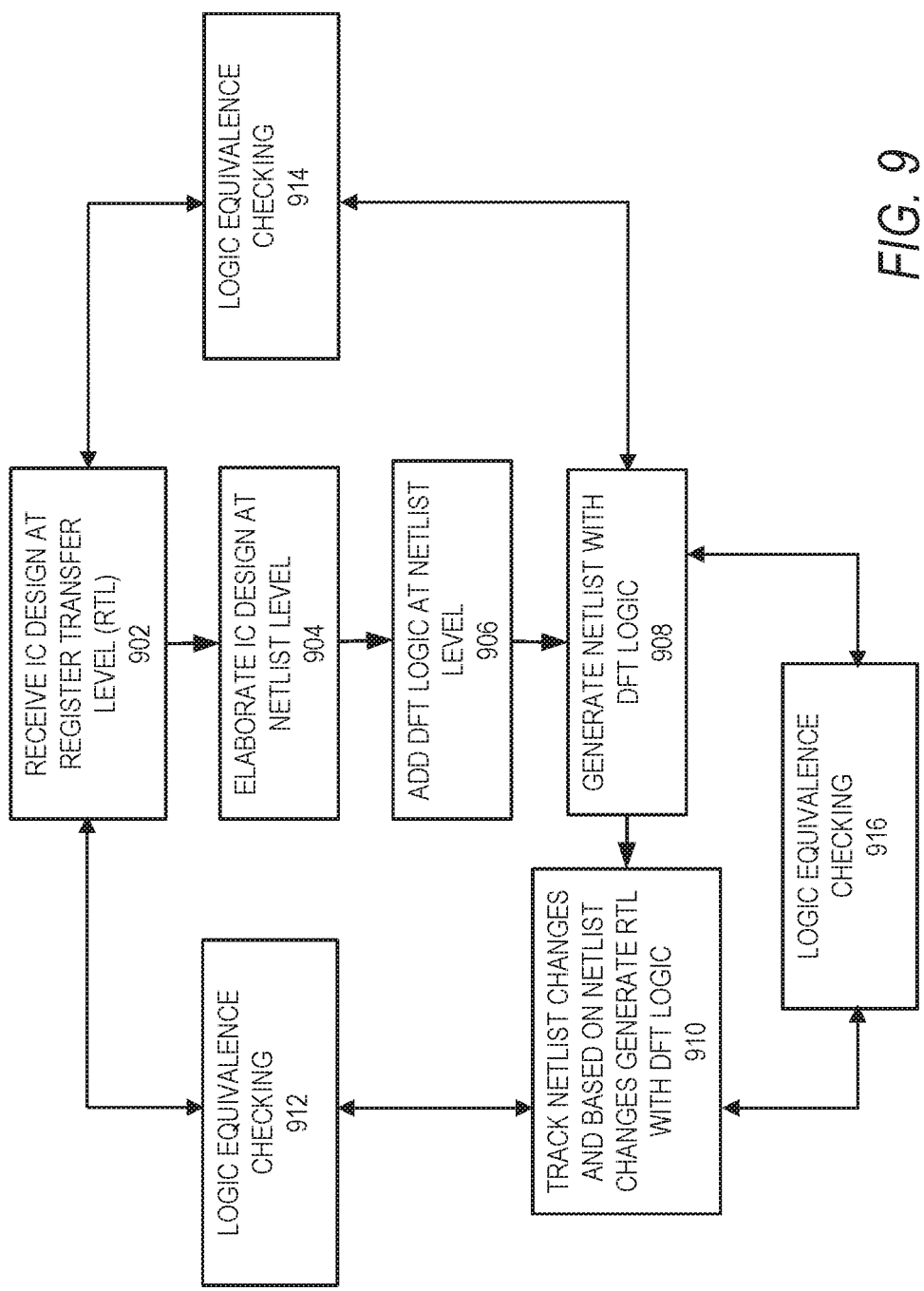
FIG. 9 is an example of a process flow of adding DFT logic to an IC design at RTL.

FIG. 9 is an example of a process flow of adding DFT logic to an IC design at RTL. At 902, an EDA computing device receives an IC design at RTL. Examples are shown in FIGS. 1 and 2. At 904, the EDA computing device elaborates the IC design at netlist level. In elaboration, the IC design is converted from a high level RTL into a low level process technology-independent gate-level netlist. Subsequently, the netlist level elements are mapped into process technology-specific cell libraries, such as in synthesis. At 906, the EDA computing device adds DFT logic. Examples are shown in FIGS. 1-3. At 908, the EDA computing device has generated the IC design at netlist level with DFT logic.

At 910, the EDA computing device generates the IC design at RTL with DFT logic at RTL, based on tracked netlist changes made during at 906. To ensure that the functional logic is correct, multiple variations of logic equivalence checking 912, 914, and 916 are performed: between the IC design at RTL at 902 prior to adding DFT logic and the netlist generated with DFT logic at 908; between the IC design at RTL at 902 prior to adding DFT logic and the IC design at RTL at 910 after adding DFT logic; and between the netlist generated with DFT logic at 908 and the IC design at RTL at 910 after adding DFT logic.

In an example runtime flow, an attribution is set to insert DFT logic in a synthesis tool. An example command generates back-annotated RTL files based on a specified directory of the elaborated netlist. Another example command adds back-annotated RTL or the netlist with DFT logic to a simulation script to generate simulation files.

An alternative to the RTL flow is the netlist flow. The figures in the application that are targeted to the RTL flow are generally applicable to the netlist flow, where "RTL" is replaced by "netlist." Thus, the logical boundary, physical boundary, and tree hierarchy also apply to the netlist flow. In one embodiment, the RTL flow is built over the netlist flow.

In one embodiment, setting an attribute such as dft_rtl_insertion enables the RTL flow. If this attribute is not set, then the flow is the netlist based flow.

In one embodiment, MBIST inserted logic (which can be RTL or a gate level netlist based on the attribute mentioned above) is generated inside of a synthesis tool. If the dft_rtl_insertion attribute is set then extra items are performed that are not performed in the netlist based flow: i. All the netlist editing commands are tracked, to track all the changes being done to the user design, and ii. Another command (such as write_dft_rtl_model after MBIST insertion) applies the tracked changes to generate the MBIST inserted RTL.

In one embodiment, the gate level netlist can be generated even for the RTL flow, as this process occurs inside of the synthesis tool.

Figure 10:
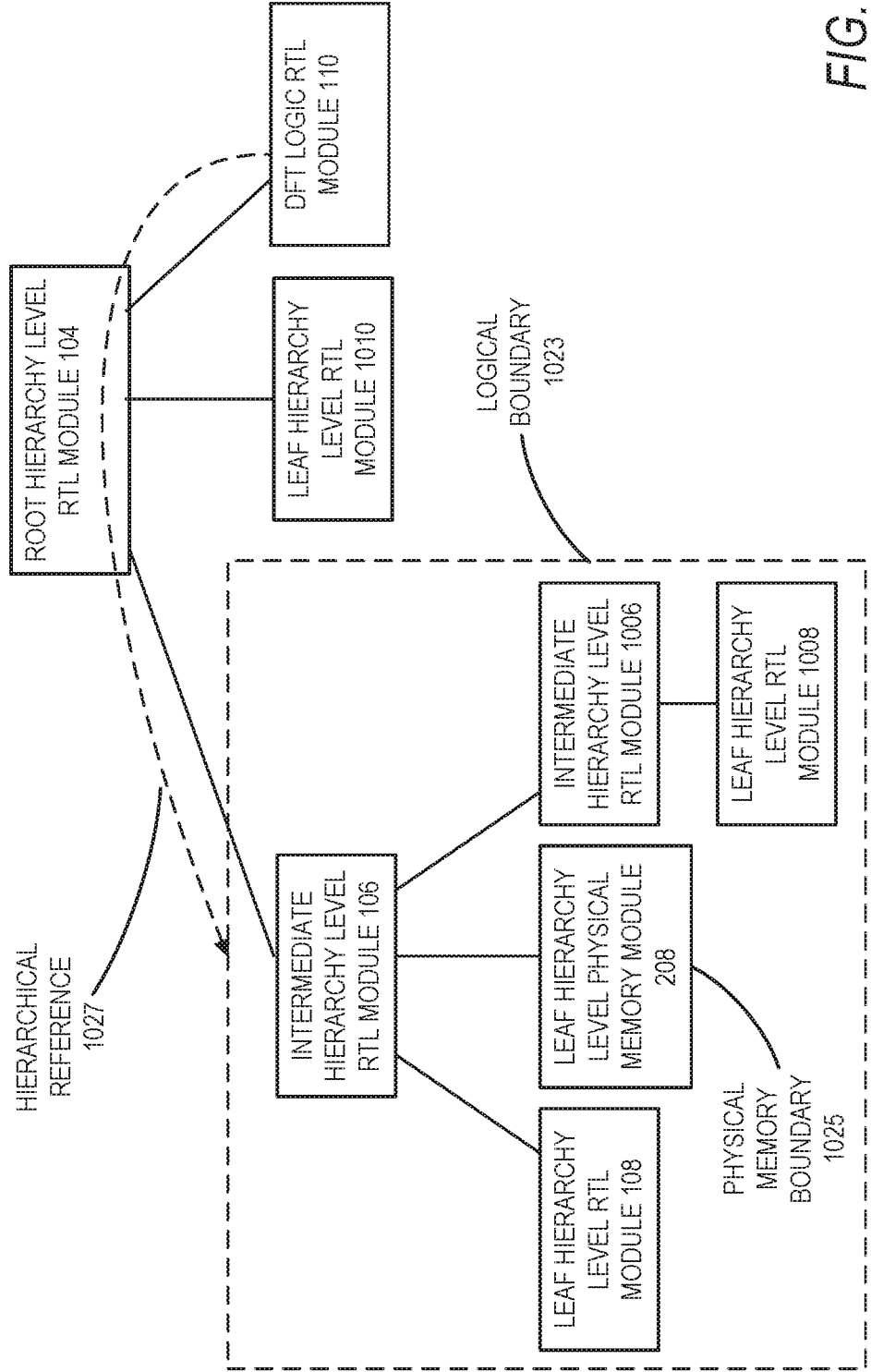
FIG. 10 is an example tree structure hierarchy of an IC design at RTL.

FIG. 10 is an example tree structure hierarchy of an IC design at RTL. The IC design at RTL has root hierarchy level RTL module 104 that contains intermediate hierarchy level RTL module 106, leaf hierarchy level RTL module 1010, and DFT logic RTL module 110. Intermediate hierarchy level RTL module 106 has logical boundary 1023 that contains leaf hierarchy level module 108, leaf hierarchy level physical memory module 208 with physical memory boundary 1025, and intermediate hierarchy level RTL module 1006. In turn, intermediate hierarchy level RTL module 1006 contains leaf hierarchy level RTL module 1008. DFT logic RTL module 110 includes a port that connects to a hierarchical reference 1027 with a hierarchical path to intermediate hierarchy level RTL module 106 via logical boundary 1023. The hierarchical reference identifies the hierarchical path in the tree structure hierarchy relative to the root hierarchy level RTL module. In one embodiment the MBIST logic is inserted in a gate level netlist.

Figure 11:
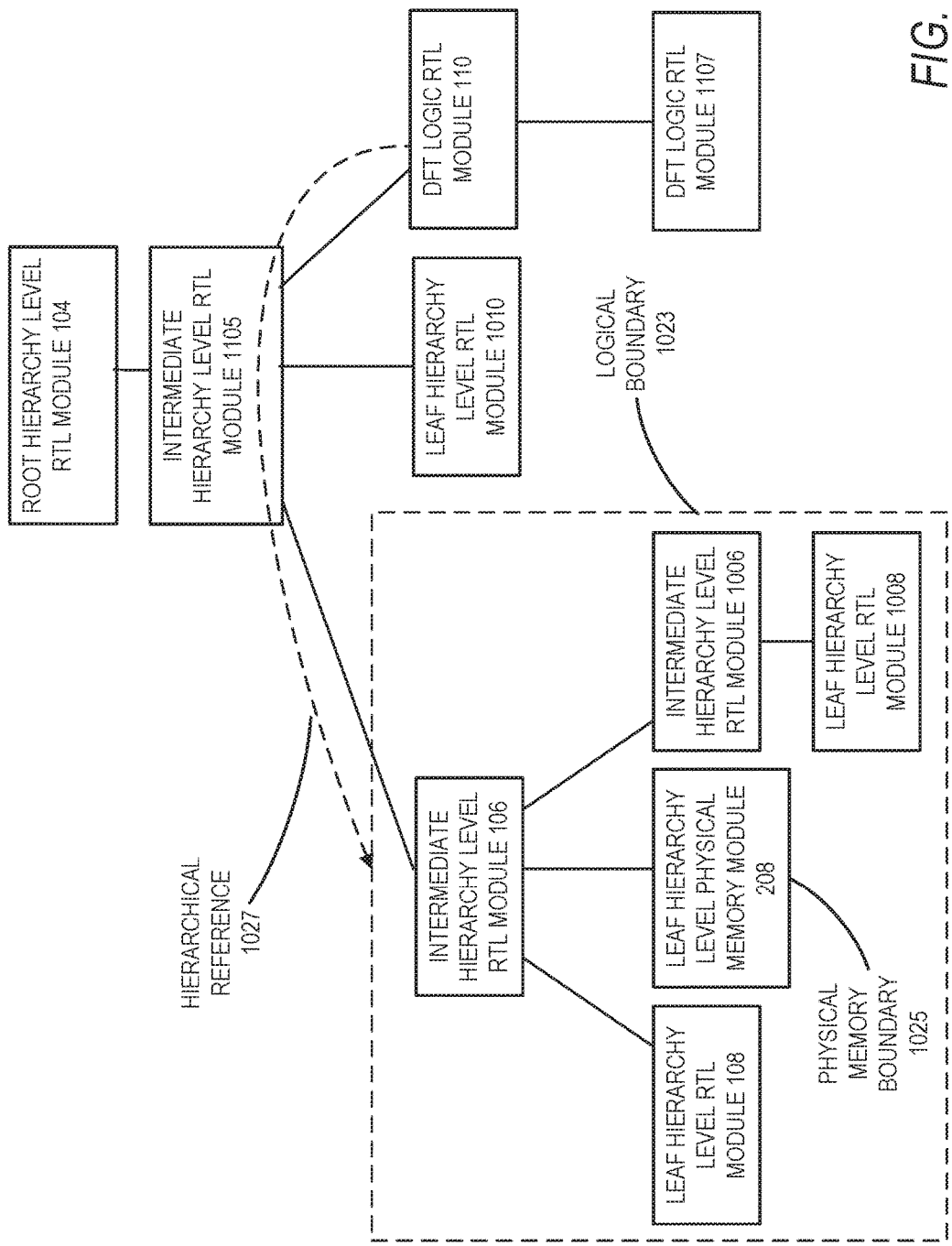
FIG. 11 is another example tree structure hierarchy of an IC design at RTL.

FIG. 11 is another example tree structure hierarchy of an IC design at RTL. FIG. 11 is generally similar to FIG. 10. The IC design at RTL has root hierarchy level RTL module 104 that contains intermediate hierarchy level RTL module 1105. Intermediate hierarchy level RTL module 1105 includes intermediate hierarchy level RTL module 106, leaf hierarchy level RTL module 1010, and DFT logic RTL module 110. DFT logic RTL module 1010 includes DFT logic RTL module 1107.

In some embodiments, some logic for the memories such as reset and acknowledgement are outside of the logical hierarchy. In some embodiments, some logic for the memories such as reset and acknowledgement are one or more ports at the top level design. Such logic for the memories can be handled with the same MBIST logic that handles memories in the logical hierarchy.

In one embodiment, the hierarchy is specified with the ".." keyword. For example, if memory "D" is present at A/B/C/D in some design and the reset logic to be controlled is at X/Y/Z/PIN in the same design then the EDA tool can specify that as ../../../X/Y/Z/PIN. Another embodiment can make similarly specify this for the pipelined register case.

Sample RTL Code.

New wires are defined in example RTL as:
wire tem_rtl_wire_1, tem_rtl_wire_2, tem_rtl_wire_3, tem_rtl_wire_4, tem_rtl_wire_5 . . . ;

In some embodiments, new instances, such as DFT logic, have no connections at the boundary for enhanced readability in example RTL:
temamu_ap0 tem_amu0(
.temsiu_si_done( ),
.temsiu_alg_done( ),
.mbist_clk( ),
. . .
.temamu_rambypass( ) );

However, inputs of other new instances, such as a non-test operation input of an MBIST multiplexer and an inverter, have connections at the boundary, in some embodiments. Connections of the new instances use hierarchical references to reduce new ports at this stage. In some embodiments, such hierarchical references are in the root hierarchy level module only. In other embodiments, such hierarchical references are in lower hierarchy level modules also (for example, with MBIST multiplexer and inverter.

Connections are present in example root hierarchy level RTL:
assign tem_siu0.mbist_clk=CLK;
assign check.tem_amu0.mda_tck=CLK;
assign
l1b1.l2m5.tem_ff_tem_siu0_temsiu_rwoe_level3.mbist_clk=ref_clkd_mux.Y Connections are present where a new instance is created in example RTL of a new instance:
assign
tem_mux_test_2_genblk_1_sram_96_14_1r_1w_AA.a=A[0];
not JTAG_ENABLE_TDO_INV(tem_rtl_wire_1, tem_rtl_wire_2);

Definition of an example original RTL module prior to modification for DFT logic to add new ports:
module BLOCK_B (A, B, CLK, RESET, START, SSELECT, CHIP_ENABLE, SRAM_OUT, TM_4_B, MDA_TDI, MDA_TDO, MDA_RESET, MDA_DONE, MDA_FAIL, MDA_TCK, MDA_ESS, MDA_DSS);

Definition of the example original RTL module after modification for DFT logic to add new ports. In some embodiments, this happens in a particular flow and for the root module; otherwise, no port/pin is added at any module. That is automatically done during elaboration of the design having hierarchical references.
module BLOCK_B (A, B, CLK, RESET, START, SSELECT,
CHIP_ENABLE, SRAM_OUT, TM_4_B,
MDA_TDI, MDA_TDO, MDA_RESET,
MDA_DONE, MDA_FAIL, MDA_TCK, MDA_ESS,
MDA_DSS, retention_pause_active,
retention_pause_continue, temmda_tdi,
temmda_reset_sum, temmda_tdo, temmda_reset););
output retention_pause_active;

input retention_pause_continue;
input temmda_tdi;
input temmda_reset_sum;
output temmda_tdo;
output temmda_reset;
Example RTL prior to disconnection of a single bit:
hdss1_17×2cm4sw1 virage_mem (
   .ADR(A[4:0]),
   .D(B[1:0]),
   .CLK(CLK1),
   .AWT(n_RESET),
Example RTL after disconnection of a single bit:
hdss1_17×2cm4sw1 virage_mem (
   .ADR(A[4:0]),
   .D(B[1:0]),
   .CLK( ),
   .AWT( ),
Any subsequent reconnections use hierarchical references.
Example RTL with 7-bit bus (AB[6:0]) connected to "add_bus" for which a single bit (AB[5]) is modified with a new connection, prior to disconnection:
   RF96X14_1R_1W sram_96_14_1r_1w (.AB(add_bus), . . . );
Example RTL with the original 7-bit bus (AB[6:0]) replaced by 7 single-bit wires:
   RF96X14_1R_1W sram_96_14_1r_1w(
   .AB({tem_rtl_wire_190, tem_rtl_wire_191,
   tem_rtl_wire_192, tem_rtl_wire_193,
   tem_rtl_wire_194, tem_rtl_wire_195,
   tem_rtl_wire_196}), . . . )
Example RTL to receive the original driver of "AB" pins with 7 more single-bit wires:
   assign
   {tem_rtl_wire_197, tem_rtl_wire_198, tem_rtl_wire_199,
   tem_rtl_wire_200, tem_rtl_wire_201,
   tem_rtl_wire_202,
   tem_rtl_wire_203}=add_bus;
Example RTL to reconnect pins AB[6] and AB[4:0] that do not get a new connection back to the original driver:
   assign tem_rtl_wire_190=tem_rtl_wire_197;
   assign tem_rtl_wire_192=tem_rtl_wire_199;
   assign tem_rtl_wire_193=tem_rtl_wire_200;
   assign tem_rtl_wire_194=tem_rtl_wire_201;
   assign tem_rtl_wire_195=tem_rtl_wire_202;
   assign tem_rtl_wire_196=tem_rtl_wire_203;
Example RTL to make new connection to pin AB[5] from a new driver, for example a multiplexer output:
   assign sram_96_14_1r_1w.AB[5]=l1m1.tem_mux_AB_6.y;
Example RTL prior to disconnection of a memory instance inside a generate statement:
   generate for (i1=1; i1<=2; i1=i1+1) begin
   RF96X14_1R_1W sram_96_14_1r_1w (
   .CENB (n_CHIP_ENABLE),
   .AB(A[(i1*7)+9:((i1−1)*7)+10]),
   .DB(B[(i1*14)+3:((i1−1)*14)+4]),
   .CENA(n_CHIP_ENABLE),
   .AA(A[(i1*7)+9:((i1−1)*7)+10]),
   .CLKB(CLK2),
   .CLKA(CLK1),
   .QA(n_SRAM_OUT[(i1*14)+3:((i1−1)*14)+4]));
   end
   endgenerate Example RTL after disconnection of a memory instance inside a generate statement:
   generate for (i1=1; i1<=2; i1=i1+1) begin
   RF96X14_1R_1W sram_96_14_1r_1w(
   .CENB ( ),
   .AB( ),
   .DB( ),
   .CENA( ),
   .AA( ),
   .CLKB(CLK2),
   .CLKA( ),
   .QA(n_SRAM_OUT[(i1*14)+3:((i1−1)*14)+4]));
   end
   endgenerate
Any subsequent reconnections use hierarchical references.

In some embodiments, connections for the memory instances inside a generate statement are added at root hierarchy level. In other embodiments, connections such as hierarchical references are in lower hierarchy level modules also (for example, with MBIST multiplexer and inverter). New multiplexers before the memory instance are added outside the generate statement.

Example RTL of a new multiplexer instance outside of a generate statement but present in the same hierarchical level of the generate statement:
   temvmux_w7
   tem_mux_test_2_genblk_1_sram_96_14_1r_1w_AA(
   .a( ), .b( ), .s0( ), .y( ));
Connection for a non-test operation input of an MBIST multiplexer is located where the multiplexer is created. In example RTL, variable such as "i1" is replaced with the proper value of the variable, although in other embodiments, the complete expression is evaluated:
   assign tem_mux_test_2_genblk_1_sram_96_14_1r_1w_AA.a=A[(2*7)+9:((2−1)*7)+10];
Example RTL of a connection to a multiplexer selector control created at root hierarchy level:
   assign tem_mux_test_2_genblk_1_sram_96_14_1r_1w_AA.s0=tem_amu0.temamu_active[0];
Example RTL of a connection to test operation input of a multiplexer created at root hierarchy level:
   assign tem_mux_test_2_genblk_1_sram_96_14_1r_1w_AA.b[0]=tem_siu1.temsiu_raddr[0];
Example RTL of a connection to output of a multiplexer going to memory input:
   assign test[2].genblk[1].sram_96_14_1r_1w.AA[0]=tem_mux_test_2_genblk_1_sram_96_14_1r_1w_AA.y[0];
When a module is instantiated multiple times and memory is present inside that module, in some embodiments, elaboration uniquifies, or uniquely identifies, the modules, or mutually distinguishes the modules with module names.

Example of user design RTL of multiple copies of module "ABC":
   ABC ABC_inst1 (.AB(add_bus_1), . . . );
   ABC ABC_inst2 (.AB(add_bus_2), . . . );
   ABC ABC_inst3 (.AB(add_bus_3), . . . );
Example RTL after elaboration of multiple copies of module "ABC":
   ABC_1 ABC_inst1 (.AB(add_bus_1), . . . );
   ABC_2 ABC_inst2 (.AB(add_bus_2), . . . );
   ABC_3 ABC_inst3 (.AB(add_bus_3), . . . );
Example RTL that module "ABC" contains memory "RF96X14_1R_1W":
   RF96X14_1R_1W sram_96_14_1r_1w (.AB(add_bus), . . . );

In elaboration, unique modules are created such as ABC_1, ABC_2, ABC_3, and so forth. While doing back-annotation to the source RTL, unique copies are created to handle different scenarios.

Figure 12:
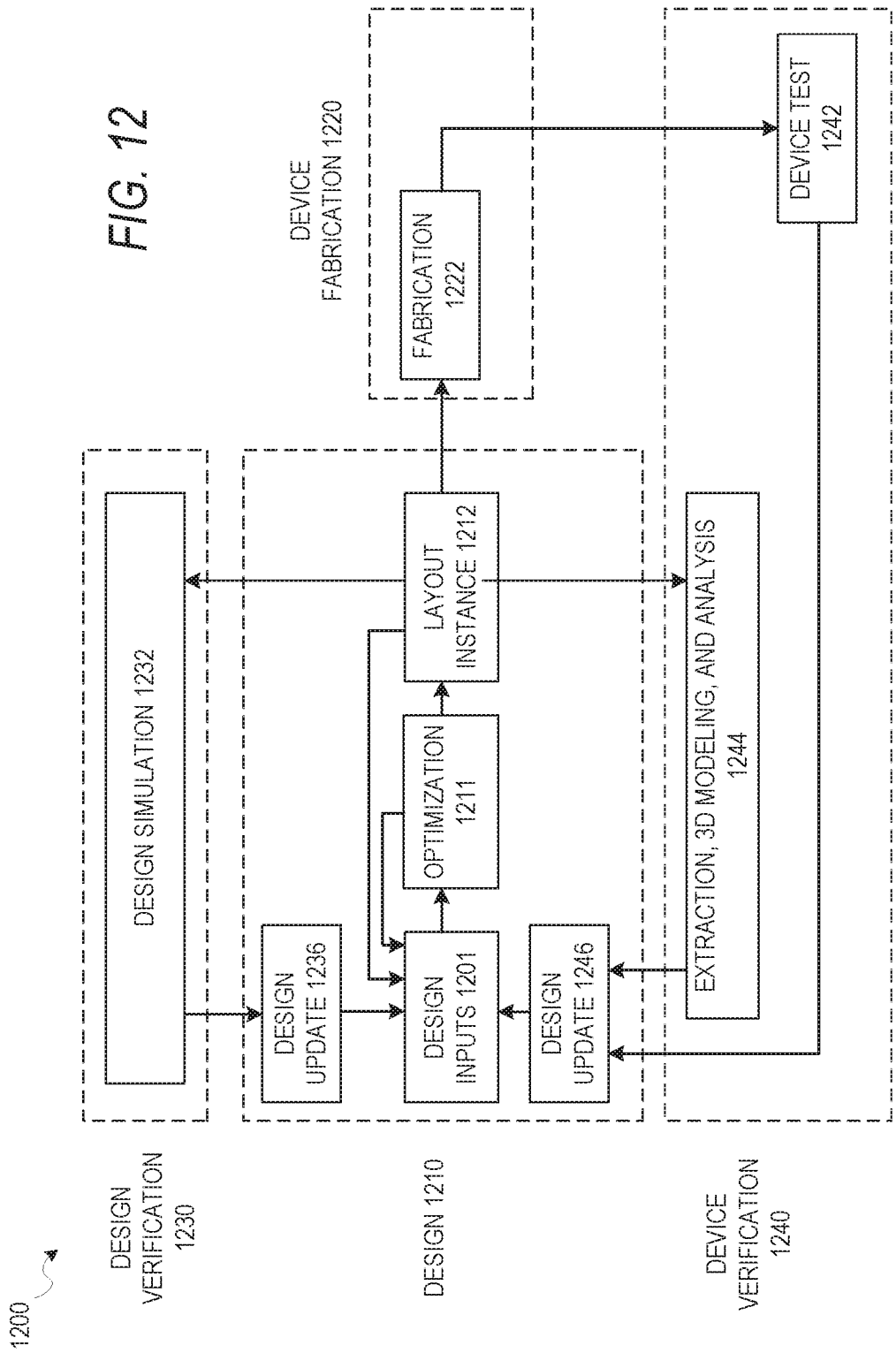
FIG. 12 is a diagram illustrating one possible design process flow for low power verification for mixed signal circuit designs, according to some example embodiments.

Example back-annotated RTL with multiple copies of module "ABC" with unique names, such that each module (ABC_1, ABC_2, ABC_3) contains memory "RF96X14_1R_1W":

ABC_1 ABC_inst1 (.AB(add_bus_1), . . . );
    ABC_2 ABC_inst2 (.AB(add_bus_2), . . . );
    ABC_3 ABC_inst3 (.AB(add_bus_3), . . . );

Example back-annotated RTL with connections/modifications present inside each module as per the design requirements:

RF96X14_1R_1W sram_96_14_1r_1w (.AB( . . . ), . . . );

Example RTL of a module "ABC" instantiated multiple times inside a generate statement, such that memory is present inside that module, and elaboration creates unique modules:

generate
        for (i1=1; i1<=3; i1=i1+1) begin: test
            ABC ABC_inst (.AB(add_bus[i1]), . . . );
        end
    endgenerate Example RTL of a module "ABC" that contains memory "RF96X14_1R_1W":

RF96X14_1R_1W    sram_96_14_1r_1w    (.AB(add_bus), . . . );

Following the creation of multiple unique modules in elaboration such as ABC_1, ABC_2, ABC_3, and so forth, multiple unique copies are created in back-annotation to source RTL to handle different scenarios. Example of back-annotated RTL with multiple copies of module "ABC" with unique names:

generate
        for (i1=1; i1<=3; i1=i1+1) begin: test
            if(i1==1)
                ABC_1 ABC_inst (.AB(add_bus[i1]), . . . );
            else if(i1=2)
                ABC_2 ABC_inst (.AB(add_bus[i1]), . . . );
            else
                ABC_3 ABC_inst (.AB(add_bus[i1]), . . . );
        end
    endgenerate Example RTL of connections/modifications inside each module (ABC_1, ABC_2, ABC_3) that contains memory "RF96X14_1R_1W" per the design requirements:

RF96X14_1R_1W sram_96_14_1r_1w (.AB( . . . ), . . . );

FIG. 12 is a diagram illustrating one possible design process flow for low power verification for mixed signal circuit designs, according to some example embodiments. As illustrated, the overall design flow 1200 includes a design phase 1210, a device fabrication phase 1220, a design verification phase 1230, and a device verification phase 1240. The design phase 1210 involves an initial design input operation 1201 where the basic elements and functionality of a device are determined, as well as revisions based on various analyses and optimization of a circuit design. This design input operation 1201 is where instances of an EDA circuit design file are used in the design and any additional circuitry is selected. The initial strategy, tactics, and context for the device to be created are also generated in the design input operation 1201, depending on the particular design algorithm to be used.

In some embodiments, design phase 1210 includes creation and/or access of the RTL design to add DFT logic such as MBIST logic.

After design inputs are used in the design input operation 1201 to generate a circuit layout, and any optimization operations 1211 are performed, a layout is generated in the layout instance 1212. The layout describes the physical layout dimensions of the device that match the design inputs. This layout may then be used in the device fabrication operation 1222 to generate a device, or additional testing and design updates may be performed using designer inputs or automated updates based on design simulation 1232 operations, three-dimensional (3D) modeling, and analysis 1244 operations.

In some embodiments, design phase 1210 adds DFT logic such as MBIST logic to the RTL.

Once the device is generated, the device can be tested as part of device test 1242 operations and layout modifications generated based on actual device performance.

Design updates 1236 from the design simulation 1232, design updates 1246 from the device test 1242, 3D modeling, and analysis 1244 operations, or the design input operation 1201 may occur after an initial layout instance 1212 is generated. In various embodiments, whenever design inputs are used to update or change an aspect of a circuit design, a timing analysis and optimization operation 1211 may be performed.

Figure 13:
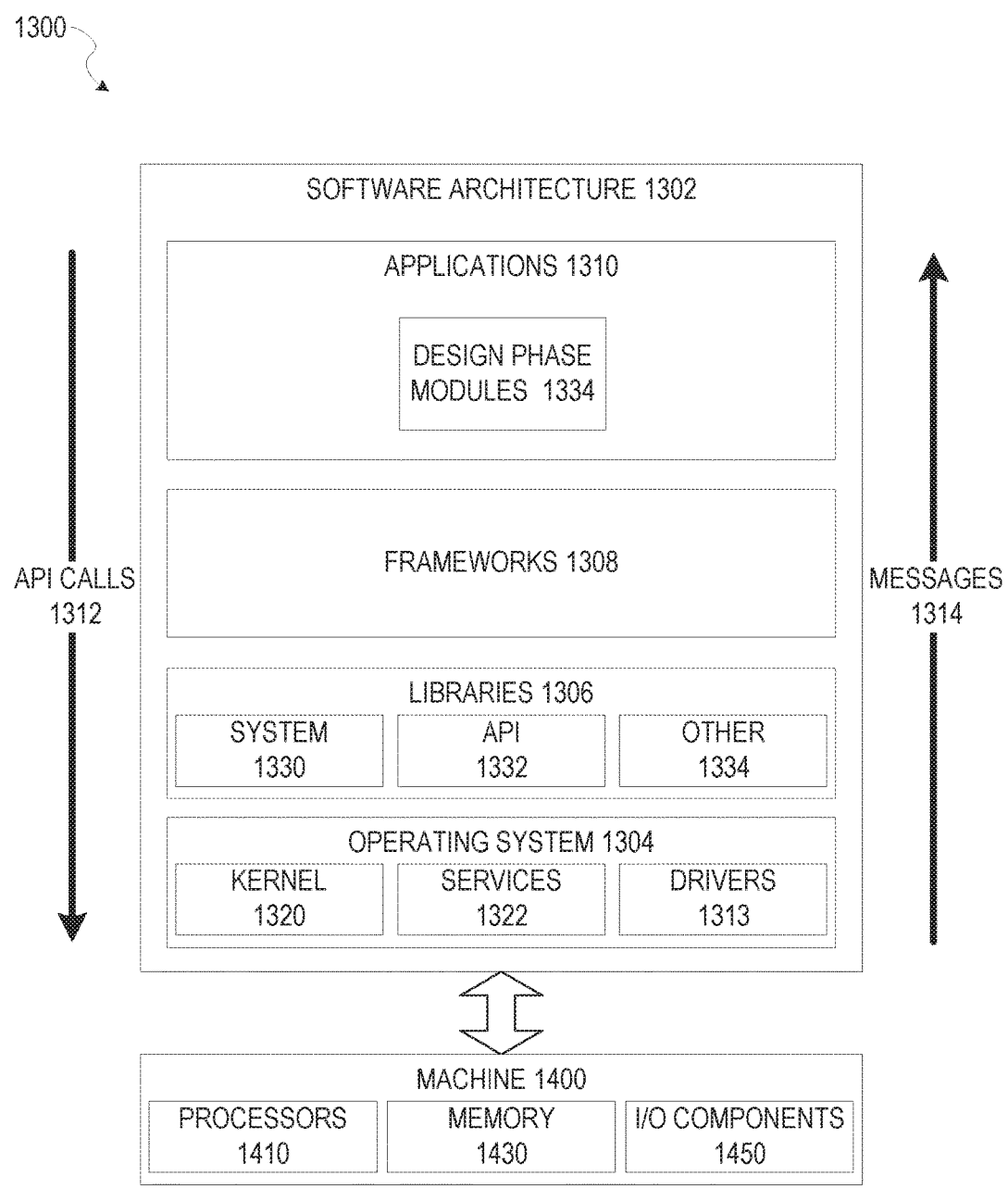
FIG. 13 is a block diagram illustrating an example of a software architecture that may be operating on an EDA computer and used to perform low power verification for mixed signal circuit designs, according to some example embodiments.

FIG. 13 is a block diagram 1300 illustrating an example of a software architecture 1302 operating on an EDA computer and used to add DFT logic such as MBIST logic to implement any of the methods described herein. Aspects of software architecture 1302 are, in various embodiments, used to generate power-related connectivity data and to determine consistency between different versions of power-related connectivity data to verify circuit designs, with physical devices generated using these circuit designs.

FIG. 13 is merely a non-limiting example of a software architecture 1302, and it will be appreciated that many other architectures can be implemented to facilitate the functionality described herein. In various embodiments, the software architecture 1302 is implemented by hardware such as machine 1300 that includes processors 1310, memory 1330, and input/output (I/O) components 1350. In this example, the software architecture 1302 can be conceptualized as a stack of layers where each layer may provide a particular functionality. For example, the software architecture 1302 includes layers such as an operating system 1304, libraries 1306, frameworks 1308, and applications 1310. Operationally, the applications 1310 invoke application programming interface (API) calls 1312 through the software stack and receive messages 1314 in response to the API calls 1312, consistent with some embodiments. In various embodiments, any client device, server computer of a server system, or any other device described herein may operate using elements of software architecture 1302. An EDA computing device described herein may additionally be implemented using aspects of the software architecture 1302, with the software architecture 1302 adapted for adding DFT logic such as MBIST logic in any manner described herein.

In one embodiment, an EDA application of applications 1310 adds DFT logic such as MBIST logic according to embodiments described herein using various modules such as design phase modules 1334 within software architecture 1302. For example, in one embodiment, an EDA computing device similar to machine 1400 includes memory 1430 and one or more processors 1410. The processors 1410 implement design phase 1210 to add DFT logic such as MBIST logic.

In various other embodiments, rather than being implemented as modules of one or more applications 1310, some or all of modules 1334 may be implemented using elements of libraries 1306 or operating system 1304.

In various implementations, the operating system 1304 manages hardware resources and provides common services. The operating system 1304 includes, for example, a kernel 1320, services 1322, and drivers 1313. The kernel 1320 acts as an abstraction layer between the hardware and the other software layers, consistent with some embodiments. For example, the kernel 1320 provides memory management, processor management (e.g., scheduling), component management, networking, and security settings, among other functionality. The services 1322 can provide other common services for the other software layers. The drivers 1313 are responsible for controlling or interfacing with the underlying hardware, according to some embodiments. For instance, the drivers 1313 can include display drivers, signal processing drivers to optimize modeling computation, memory drivers, serial communication drivers (e.g., Universal Serial Bus (USB) drivers), WI-FI® drivers, audio drivers, power management drivers, and so forth.

In some embodiments, the libraries 1306 provide a low-level common infrastructure utilized by the applications 1310. The libraries 1306 can include system libraries 1330 such as libraries of analog, digital, and power-management blocks for use in an EDA environment or other libraries that can provide functions such as memory allocation functions, string manipulation functions, mathematic functions, and the like. In addition, the libraries 1306 can include API libraries 1332 such as media libraries (e.g., libraries to support presentation and manipulation of various media formats such as Moving Picture Experts Group-4 (MPEG4), Advanced Video Coding (H.264 or AVC), Moving Picture Experts Group Layer-3 (MP3), Advanced Audio Coding (AAC), Adaptive Multi-Rate (AMR) audio codec, Joint Photographic Experts Group (JPEG or JPG), or Portable Network Graphics (PNG)), graphics libraries (e.g., an OpenGL framework used to render in two dimensions (2D) and 3D in a graphic content on a display), database libraries (e.g., SQLite to provide various relational database functions), web libraries (e.g., WebKit to provide web browsing functionality), and the like. The libraries 1306 may also include other libraries 1334.

The software frameworks 1308 provide a high-level common infrastructure that can be utilized by the applications 1310, according to some embodiments. For example, the software frameworks 1308 provide various graphic user interface (GUI) functions, high-level resource management, high-level location services, and so forth. The software frameworks 1308 can provide a broad spectrum of other APIs that can be utilized by the applications 1310, some of which may be specific to a particular operating system or platform. In various embodiments, the systems, methods, devices, and instructions described herein may use various files, macros, libraries, and other elements of an EDA design environment to implement analysis described herein. This includes analysis of input design files for an integrated circuit design, along with any element of hierarchical analysis that may be used as part of or along with the embodiments described herein. While netlist files, library files, Synopsys Design Constraint (SDC) files and view definition files are examples that may operate within a software architecture 1302, it will be apparent that other files and structures may provide a similar function, in various embodiments.

Certain embodiments are described herein as including logic or a number of components, modules, elements, or mechanisms. Such modules can constitute either software modules (e.g., code embodied on a machine-readable medium or in a transmission signal) or hardware modules. A "hardware module" is a tangible unit capable of performing certain operations and can be configured or arranged in a certain physical manner. In various example embodiments, one or more computer systems (e.g., a standalone computer system, a client computer system, or a server computer system) or one or more hardware modules of a computer system (e.g., a processor or a group of processors) is configured by software (e.g., an application or application portion) as a hardware module that operates to perform certain operations as described herein.

In some embodiments, a hardware module is implemented mechanically, electronically, or any suitable combination thereof. For example, a hardware module can include dedicated circuitry or logic that is permanently configured to perform certain operations. For example, a hardware module can be a special-purpose processor, such as a field-programmable gate array (FPGA) or an application specific integrated circuit (ASIC). A hardware module may also include programmable logic or circuitry that is temporarily configured by software to perform certain operations. For example, a hardware module can include software encompassed within a general-purpose processor or other programmable processor. It will be appreciated that the decision to implement a hardware module mechanically, in dedicated and permanently configured circuitry, or in temporarily configured circuitry (e.g., configured by software) can be driven by cost and time considerations.

Accordingly, the phrase "module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software can accordingly configure a particular processor or processors, for example, to constitute a particular hardware module at one instance of time and to constitute a different hardware module at a different instance of time.

Hardware modules can provide information to, and receive information from, other hardware modules. Accordingly, the described hardware modules can be regarded as being communicatively coupled. Where multiple hardware modules exist contemporaneously, communications can be achieved through signal transmission (e.g., over appropriate circuits and buses) between or among two or more of the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module performs an operation and stores the output of that operation in a memory device to which it is communicatively coupled. A further hardware module can then, at a later time, access the memory device to retrieve and process the stored output. Hardware modules can also initiate communications with input or output devices, and can operate on a resource (e.g., a collection of information).

The various operations of example methods described herein can be performed, at least partially, by one or more processors that are temporarily configured (e.g., by software) or permanently configured to perform the relevant operations. Whether temporarily or permanently configured, such processors constitute processor-implemented modules that operate to perform one or more operations or functions described herein. As used herein, "processor-implemented module" refers to a hardware module implemented using one or more processors.

Similarly, the methods described herein can be at least partially processor-implemented, with a particular processor or processors being an example of hardware. For example, at least some of the operations of a method can be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines 1400 including processors 1410), with these operations being accessible via a network (e.g., the Internet) and via one or more appropriate interfaces (e.g., an API). In certain embodiments, for example, a client device may relay or operate in communication with cloud computing systems, and may store media content such as images or videos generated by devices described herein in a cloud environment.

The performance of certain of the operations may be distributed among the processors, not only residing within a single machine 1400, but deployed across a number of machines 1400. In some example embodiments, the processors 1410 or processor-implemented modules are located in a single geographic location (e.g., within a home environment, an office environment, or a server farm). In other example embodiments, the processors or processor-implemented modules are distributed across a number of geographic locations.

Figure 14:
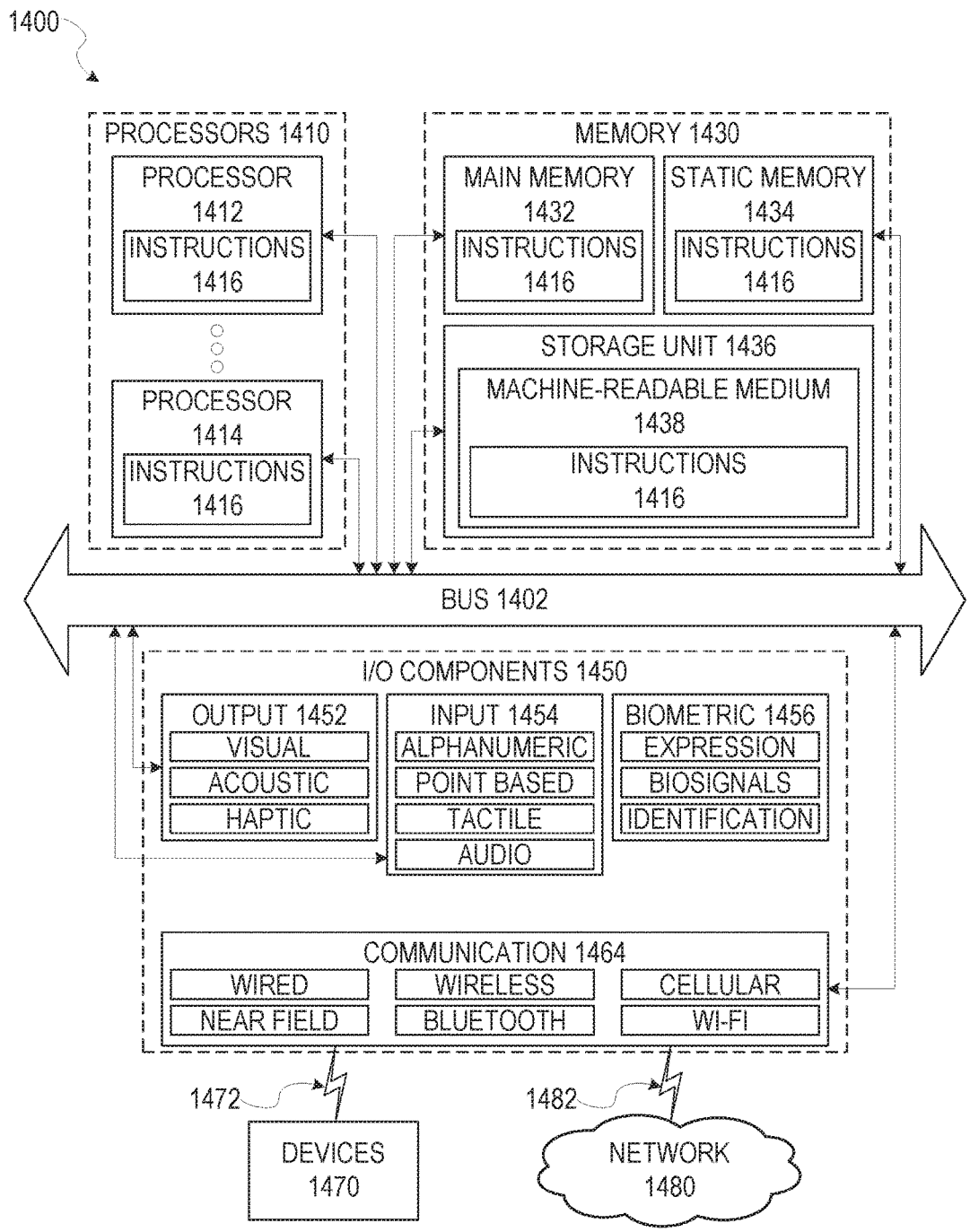
FIG. 14 is a diagrammatic representation of a machine in the form of a computer system within which a set of instructions are executable, causing the machine to perform low power verification for mixed signal circuit designs according to some example embodiments.

FIG. 14 is a diagrammatic representation of a machine 1400 in the form of a computer system within which a set of instructions are executable, causing the machine to add DFT logic such as MBIST logic according to some example embodiments discussed herein. FIG. 14 shows components of the machine 1400, which is, according to some embodiments, able to read instructions from a machine-readable medium (e.g., a machine-readable storage medium) and perform any one or more of the methodologies discussed herein. Some embodiments cause a networking device to transmit the instructions that are subsequently performed by the machine 1400. Example of a networking device are a router, gateway, switch, bridge, network card, hub, and modem. Specifically, FIG. 14 shows a diagrammatic representation of the machine 1400 in the example form of a computer system, within which instructions 1416 (e.g., software, a program, an application, an applet, an app, or other executable code) causing the machine 1400 to perform any one or more of the methodologies discussed herein are executable. In alternative embodiments, the machine 1400 operates as a standalone device or can be coupled (e.g., networked) to other machines. In a networked deployment, the machine 1400 operates in the capacity of a server machine or a client machine in a server-client network environment, or as a peer machine in a peer-to-peer (or distributed) network environment. Examples of the machine 1400 are a server computer, a client computer, a personal computer (PC), a tablet computer, a laptop computer, a netbook, a set-top box (STB), a personal digital assistant (PDA), a media system, a cellular telephone, a smart phone, a mobile device, or any machine capable of executing the instructions 1416, sequentially or otherwise, that specify actions to be taken by the machine 1400. Further, while only a single machine 1400 is illustrated, the term "machine" also includes a collection of machines 1400 that individually or jointly execute the instructions 1416 to perform any one or more of the methodologies discussed herein.

In various embodiments, the machine 1400 comprises processors 1410, memory 1430, and I/O components 1450, which are configurable to communicate with each other via a bus 1402. In an example embodiment, the processors 1410 (e.g., a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC), another processor, or any suitable combination thereof) include, for example, a processor 1412 and a processor 1414 that are able to execute the instructions 1416. In one embodiment the term "processor" includes multi-core processors 1410 that comprise two or more independent processors 1412, 1414 (also referred to as "cores") that are able to execute instructions 1416 contemporaneously. Although FIG. 14 shows multiple processors 1410, in another embodiment the machine 1400 includes a single processor 1412 with a single core, a single processor 1412 with multiple cores (e.g., a multi-core processor 1412), multiple processors 1410 with a single core, multiple processors 1410 with multiples cores, or any combination thereof.

The memory 1430 comprises a main memory 1432, a static memory 1434, and a storage unit 1436 accessible to the processors 1410 via the bus 1402, according to some embodiments. The storage unit 1436 can include a machine-readable medium 1438 on which are stored the instructions 1416 embodying any one or more of the methodologies or functions described herein. The instructions 1416 can also reside, completely or at least partially, within the main memory 1432, within the static memory 1434, within at least one of the processors 1410 (e.g., within the processor's cache memory), or any suitable combination thereof, during execution thereof by the machine 1400. Accordingly, in various embodiments, the main memory 1432, the static memory 1434, and the processors 1410 are examples of machine-readable media 1438.

As used herein, the term "memory" refers to a machine-readable medium 1438 able to store data volatilely or non-volatilely and may be taken to include, but not be limited to, random-access memory (RAM), read-only memory (ROM), buffer memory, flash memory, and cache memory. While the machine-readable medium 1438 is shown, in an example embodiment, to be a single medium, the term "machine-readable medium" includes a single medium or multiple media (e.g., a centralized or distributed database, or associated caches and servers) storing the instructions 1416. The term "machine-readable medium" also includes any medium, or combination of multiple media, that is capable of storing instructions (e.g., instructions 1416) for execution by a machine (e.g., machine 1400), such that the instructions 1416, when executed by one or more processors of the machine 1400 (e.g., processors 1410), cause the machine 1400 to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" includes, but is not limited to, one or more data repositories in the form of a solid-state memory (e.g., flash memory), an optical medium, a magnetic medium, other non-volatile memory (e.g., erasable programmable read-only memory (EPROM)), or any suitable combination thereof. The term "machine-readable medium" specifically excludes non-statutory signals per se.

The I/O components 1450 include a wide variety of components to receive input, provide output, produce output, transmit information, exchange information, capture measurements, and so on. In general, the I/O components 1450 can include many other components that are not shown in FIG. 14. The I/O components 1450 are grouped according to functionality merely for simplifying the following discussion, and the grouping is in no way limiting. In various example embodiments, the I/O components 1450 include output components 1452, input components 1454, and biometric components 1456. The output components 1452 include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor), other signal generators, and so forth. The input components 1454 include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or other pointing instruments), tactile input components (e.g., a physical button, a touch screen that provides location and force of touches or touch gestures, or other tactile input components), audio input components (e.g., a microphone), and the like.

In some embodiments, outputs from an EDA computing device may include design documents, files for additional steps in a design flow, or outputs for circuit fabrication. In various embodiments, EDA outputs are used to generate updates and changes to a circuit design, and once a final closure of timing with all associated timing thresholds and design requirements are met, circuit design output files are used to generate masks and other physical outputs for generation of a circuit. As described herein, "requirements," "design elements," and other aspects of a circuit design refer to selectable values that are set as part of the design of a circuit. Such design requirements or elements may be adjusted by a system operator or circuit designer to suit the particular goals of a project or circuit that results from the operations described herein.

Communication is implementable using a wide variety of technologies. The I/O components 1450 may include communication components 1464 operable to couple the machine 1400 to a network 1480 or devices 1470 via a coupling 1482 and a coupling 1472, respectively. For example, the communication components 1464 include a network interface component or another suitable device to interface with the network 1480. In further examples, communication components 1464 include wired communication components, wireless communication components, cellular communication components, near field communication (NFC) components, BLUETOOTH® components (e.g., BLUETOOTH® Low Energy), WI-FI® components, and other communication components to provide communication via other modalities. The devices 1470 may be another machine or any of a wide variety of peripheral devices (e.g., a peripheral device coupled via a USB).

Transmission Medium

In various example embodiments, one or more portions of the network 1480 can be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the public switched telephone network (PSTN), a plain old telephone service (POTS) network, a cellular telephone network, a wireless network, a WI-FI® network, another type of network, or a combination of two or more such networks. For example, the network 1480 or a portion of the network 1480 may include a wireless or cellular network, and the coupling 1482 may be a Code Division Multiple Access (CDMA) connection, a Global System for Mobile communications (GSM) connection, or another type of cellular or wireless coupling. In this example, the coupling 1482 can implement any of a variety of types of data transfer technology, such as Single Carrier Radio Transmission Technology (1xRTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High-speed Packet Access (HSPA), Worldwide Interoperability for Microwave Access (WiMAX), Long Term Evolution (LTE) standard, others defined by various standard-setting organizations, other long range protocols, or other data transfer technology.

Furthermore, the machine-readable medium 1438 is non-transitory (in other words, not having any transitory signals) in that it does not embody a propagating signal. However, labeling the machine-readable medium 1438 "non-transitory" should not be construed to mean that the medium 1438 is incapable of movement; the medium 1438 should be considered as being transportable from one physical location to another. Additionally, since the machine-readable medium 1438 is tangible, the medium 1438 is a machine-readable device.

Language

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense. The description above includes systems, methods, techniques, instruction sequences, and computing machine program products that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A method comprising:
   accessing, using one or more processors of a computing device, an integrated circuit design at register transfer level (RTL), the integrated circuit design at the RTL having a tree structure hierarchy organizing a plurality of RTL modules in the integrated circuit design at the RTL, wherein the plurality of RTL modules includes a root level RTL module at a root level of the tree structure hierarchy and a plurality of leaf level modules at a first leaf level of the tree structure hierarchy;
   adding, using the one or more processors, design for test logic at the RTL into the integrated circuit design at the RTL, the design for test logic at the RTL including a port that connects to a hierarchical reference with a hierarchical path in the tree structure hierarchy to a part of the integrated circuit design at the RTL; and
   performing, using the one or more processors, logic equivalent checking of at least one of:
     the integrated circuit design at the RTL prior to the adding the design for test logic at the RTL into the integrated circuit design at the RTL;
     the integrated circuit design at netlist level after the adding the design for test logic at netlist level; or
     the integrated circuit design at the RTL after the adding the design for test logic at the RTL into the integrated circuit design at the RTL.

2. The method of claim 1, wherein all ports of the design for test logic at the RTL have port connections to parts of the integrated circuit design at the RTL that existed in the integrated circuit design at the RTL prior to the adding the design for test logic at the RTL into the integrated circuit design at the RTL.

3. The method of claim 1, wherein the design for test logic includes a physical design for test logic module added directly into a particular RTL module of the plurality of RTL modules in the integrated circuit design at the RTL, such that in the tree structure hierarchy the design for test logic is hierarchically directly below the particular RTL module.

4. The method of claim 1, further comprising:
   prior to the adding the design for test logic at the RTL into the integrated circuit design at the RTL, adding the design for test logic at netlist level into the integrated circuit design at netlist level.

5. The method of claim 1, wherein the performing the logic equivalent checking comprises performing logic equivalence checking of both:
   the integrated circuit design at the RTL prior to the adding the design for test logic at the RTL into the integrated circuit design at the RTL, and
   the integrated circuit design at netlist level after the adding the design for test logic at netlist level.

6. The method of claim 1, wherein the design for test logic includes a memory built-in self-test logic at the RTL.

7. The method of claim 6, wherein the memory built-in self-test logic includes a physical multiplexer module having a first multiplexer data input, a second multiplexer data input, a multiplexer selector input, and a multiplexer output,
   wherein the first multiplexer data input and the selector multiplexer input are coupled to design for test control logic, the multiplexer output is coupled to the integrated circuit design under test, and the second multiplexer data input is coupled to a driver of the integrated circuit design under test under non-test operation.

8. A non-transitory computer-readable storage medium embodying instructions that, when executed by one or more processors, cause the one or more processors to perform operations comprising:
   accessing an integrated circuit design at register transfer level (RTL), the integrated circuit design at the RTL, wherein a plurality of RTL modules in the integrated circuit design at the RTL includes a root level RTL module at a root hierarchy level and a plurality of leaf level modules at a leaf hierarchy level;
   adding design for test logic at the RTL into the integrated circuit design at the RTL, the design for test logic at the RTL including a port that connects to a hierarchical reference with a hierarchical path to a part of the integrated circuit design at the RTL; and
   performing logic equivalent checking of at least one of:
     the integrated circuit design at the RTL prior to the adding the design for test logic at the RTL into the integrated circuit design at the RTL;
     the integrated circuit design at netlist level after the adding the design for test logic at netlist level; or
     the integrated circuit design at the RTL after the adding the design for test logic at the RTL into the integrated circuit design at the RTL.

9. The non-transitory computer-readable storage medium of claim 8, wherein all ports of the design for test logic at the RTL have port connections to parts of the integrated circuit design at the RTL that existed in the integrated circuit design at the RTL prior to the adding the design for test logic at the RTL into the integrated circuit design at the RTL.

10. The non-transitory computer-readable storage medium of claim 8, wherein the design for test logic includes a physical design for test logic module added directly into a particular RTL module of the plurality of RTL modules in the integrated circuit design at the RTL, such that in the tree structure hierarchy the design for test logic is hierarchically directly below the particular RTL module.

11. The non-transitory computer-readable storage medium of claim 8, wherein the operations further comprise:
    prior to the adding the design for test logic at the RTL into the integrated circuit design at the RTL, adding the design for test logic at netlist level into the integrated circuit design at netlist level.

12. The non-transitory computer-readable storage medium of claim 8, wherein the performing the logic equivalent checking comprises performing logic equivalence checking of both:
    the integrated circuit design at netlist level after the adding the design for test logic at netlist level, and
    the integrated circuit design at the RTL after the adding the design for test logic at the RTL into the integrated circuit design at the RTL.

13. The non-transitory computer-readable storage medium of claim 8, wherein the design for test logic includes a memory built-in self-test logic at the RTL.

14. The non-transitory computer-readable storage medium of claim 13, wherein the memory built-in self-test logic includes a physical multiplexer module having a first multiplexer data input, a second multiplexer data input, a multiplexer selector input, and a multiplexer output,
    wherein the first multiplexer data input and the selector multiplexer input are coupled to design for test control logic, the multiplexer output is coupled to the integrated circuit design under test, and the second multiplexer data input is coupled to a driver of the integrated circuit design under test under non-test operation.

15. A computing device comprising:
    a memory;
    one or more hardware processors coupled to the memory;
    a processor implemented design automation module configured to perform:
        adding, using one or more hardware processors of the computing device, design for test logic at register transfer level (RTL) into an integrated circuit design at the RTL, the integrated circuit design at the RTL having a tree structure hierarchy, wherein a plurality of RTL modules in the integrated circuit design at the RTL includes a root level RTL module at a root hierarchy level and a plurality of leaf level modules at a leaf hierarchy level, the design for test logic at the RTL including a port that connects to a hierarchical reference with a hierarchical path to a part of the integrated circuit design at the RTL; and
        performing logic equivalent checking of at least one of:
            the integrated circuit design at the RTL prior to the adding the design for test logic at the RTL into the integrated circuit design at the RTL;
            the integrated circuit design at netlist level after the adding the design for test logic at netlist level; or
            the integrated circuit design at the RTL after the adding the design for test logic at the RTL into the integrated circuit design at the RTL.

16. The computing device of claim 15, wherein all ports of the design for test logic at the RTL have port connections to parts of the integrated circuit design at the RTL that existed in the integrated circuit design at the RTL prior to the adding the design for test logic at the RTL into the integrated circuit design at the RTL.

17. The computing device of claim 15, wherein the design for test logic includes a physical design for test logic module added directly into a particular RTL module of the plurality of RTL modules in the integrated circuit design at the RTL, such that in the tree structure hierarchy the design for test logic is hierarchically directly below the particular RTL module.

18. The computing device of claim 15, wherein the processor implemented design automation module is configured to further perform:
    prior to the adding the design for test logic at the RTL into the integrated circuit design at the RTL, adding the design for test logic at netlist level into the integrated circuit design at netlist level.

19. The computing device of claim 15, wherein the performing the logic equivalent checking comprises performing logic equivalence checking of both:
    the integrated circuit design at the RTL prior to the adding the design for test logic at the RTL into the integrated circuit design at the RTL,
    and
    the integrated circuit design at the RTL after the adding the design for test logic at the RTL into the integrated circuit design at the RTL.

20. The computing device of claim 15, wherein the design for test logic includes a memory built-in self-test logic at the RTL.

* * * * *